United States Patent [19]
Ansel et al.

[11] Patent Number: 6,100,739
[45] Date of Patent: Aug. 8, 2000

[54] SELF-TIMED SYNCHRONOUS PULSE GENERATOR WITH TEST MODE

[75] Inventors: George M. Ansel; Sanjay Sancheti, both of Starkville, Miss.

[73] Assignee: Cypress Semiconductor Corp., San Jose, Calif.

[21] Appl. No.: 09/150,551

[22] Filed: Sep. 9, 1998

[51] Int. Cl.[7] .................................................. H03K 3/037
[52] U.S. Cl. ........................................... 327/175; 327/176
[58] Field of Search .................................... 327/172, 173, 327/174, 175, 176, 291, 295, 299

[56] References Cited

U.S. PATENT DOCUMENTS 4,217,610  8/1980  Jurgensen et al. ...................... 358/139
5,086,280  2/1992  Ohmura et al. ......................... 327/172
5,124,573  6/1992  Wong ...................................... 327/172

*Primary Examiner*—Tuan T. Lam
*Attorney, Agent, or Firm*—Christopher P. Maiorana, P.C.

[57] ABSTRACT

A circuit and method comprising (a) a first circuit configured to generate an output signal having a variable pulse width in response to an (i) input signal and (ii) a control signal and (b) a second circuit configured to generate the control signal in response to (i) the input signal and (ii) a test input. In one example, the first circuit may comprise a register configured to present the output signal and an edge detection circuit configured to present a second control signal to said second circuit. In another example, the second circuit may comprise a plurality of first gates that may generate the output signal in further response to the second control signal.

18 Claims, 3 Drawing Sheets

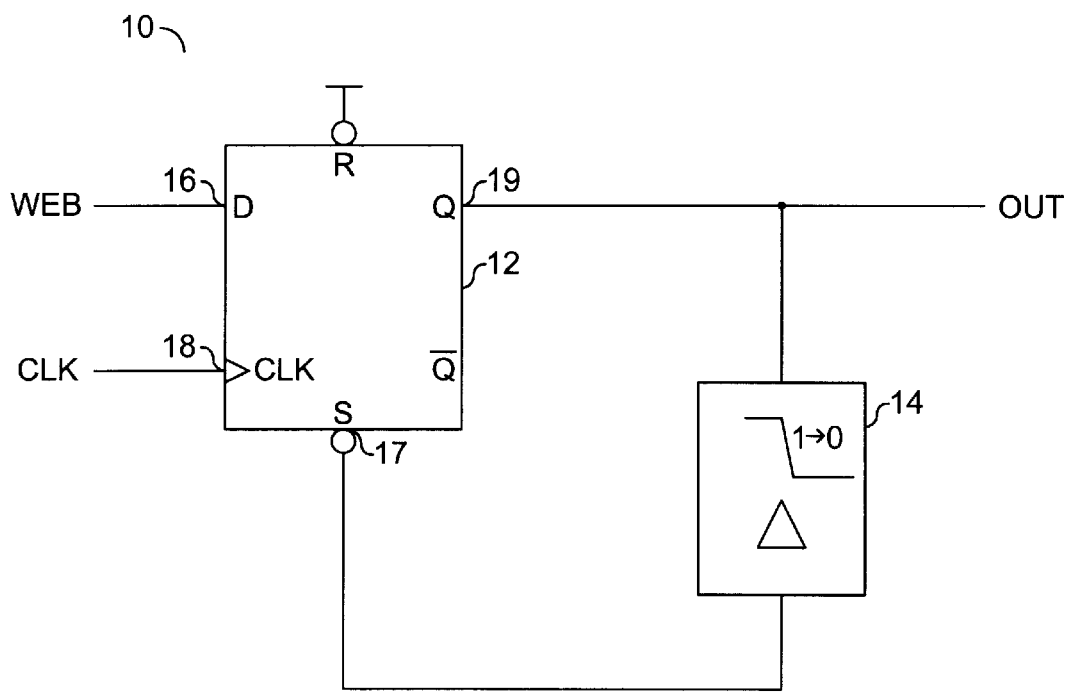
(CONVENTIONAL)
FIG. 1
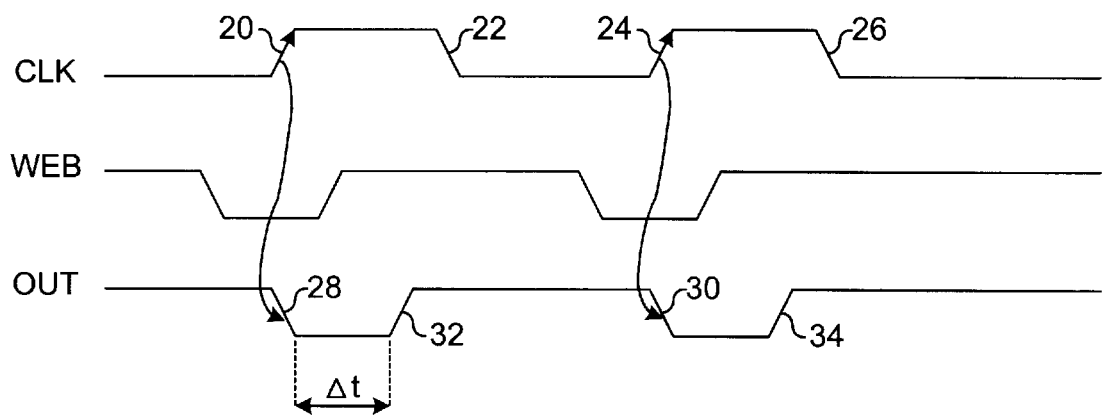
(CONVENTIONAL)
FIG. 2

SELF-TIMED SYNCHRONOUS PULSE GENERATOR WITH TEST MODE

FIELD OF THE INVENTION

The present invention relates to memories generally and, more particularly, to a write pulse generator for generating a self-timed synchronous write pulse with a test mode that may be used in a memory.

BACKGROUND OF THE INVENTION

Memory devices, such as synchronous memories, have a write pulse generator that may be used, along with other signals, to control the writing operations of the memory. The write pulse generator can provide discreet increments of internal write pulses that have a variable width. The variable width is controlled by optioning a number of delay elements in and out of a one shot pulse generator. The optioning can be accomplished with laser fusing or external configuration pins. However, such a configuration suffers from a limited minimum and maximum internal write pulse width when in a test mode. This limited write pulse width is generally due to the tester pulse width limitations.

The limitation of the conventional approaches is the lack of an independently functioning test mode. When in a normal mode, a limitation arises when testing of the memory is desired. It is necessary to determine what the minimum write pulse width will be when applied to the writing of the memory. The previous approaches require using fuse options or some other type of approach to vary the delay.

Referring to FIG. 1, an example of an conventional write pulse generator circuit 10 is shown. The circuit 10 comprises a register 12 and a negative edge triggered delay element 14. An external write enable signal (i.e., WEB) is presented to an input 16 of the register 12. An external clock signal (i.e., CLK) is presented to an input 18 of the register 12. An output 19 of the register 12 presents an output signal (i.e., OUT). The signal OUT is also presented to the delay block 14. The delay block 14 presents a signal to a set input 17 of the register 12. The particular amount of delay presented by the delay element 14 must generally be varied using the techniques described above (i.e., optioning, etc.)

Referring to FIG. 2, a timing diagram of the various signals of the circuit of FIG. 1 is shown. The signal CLK is shown having a positive transition 20, a negative transition 22, a positive transition 24, and a negative transition 26. The signal OUT is shown having a negative transition 28 that responds to the positive transition 20 as well as a negative transition 30 that responds to the positive transition 24. The signal OUT has a positive transition 32 and a positive transition 34 that responds to the negative transition 28 and a negative transition 30, respectively. The time difference between the negative transition 28 and the positive transition 32 is the delay defined by the delay element 14. The signal OUT has a number of positive and negative transitions that occur during the various cycles of the circuit 10.

SUMMARY OF THE INVENTION

The present invention concerns a circuit and method comprising (a) a first circuit configured to generate an output signal having a variable pulse width in response to an (i) input signal and (ii) a control signal and (b) a second circuit configured to generate the control signal in response to (i) the input signal and (ii) a test input. In one example, the first circuit may comprise a register configured to present the output signal and an edge detection circuit configured to present a second control signal to said second circuit. In another example, the second circuit may comprise a plurality of first gates that may generate the output signal in further response to the second control signal.

The objects, features and advantages of the present invention include providing a write pulse generator for generating a self-timed write pulse that includes a test mode. When in the test mode, the write pulse generator may generate a pulse having a variable width.

BRIEF DESCRIPTION OF THE DRAWINGS

These and other objects, features and advantages of the present invention will be apparent from the following detailed description and the appended claims and drawings in which:

FIG. 1 is a block diagram of a conventional write pulse generator;

FIG. 2 is a timing diagram of the waveforms of the circuit of FIG. 1;

DETAILED DESCRIPTION OF THE PREFERRED EMBODIMENTS

Figure 3:
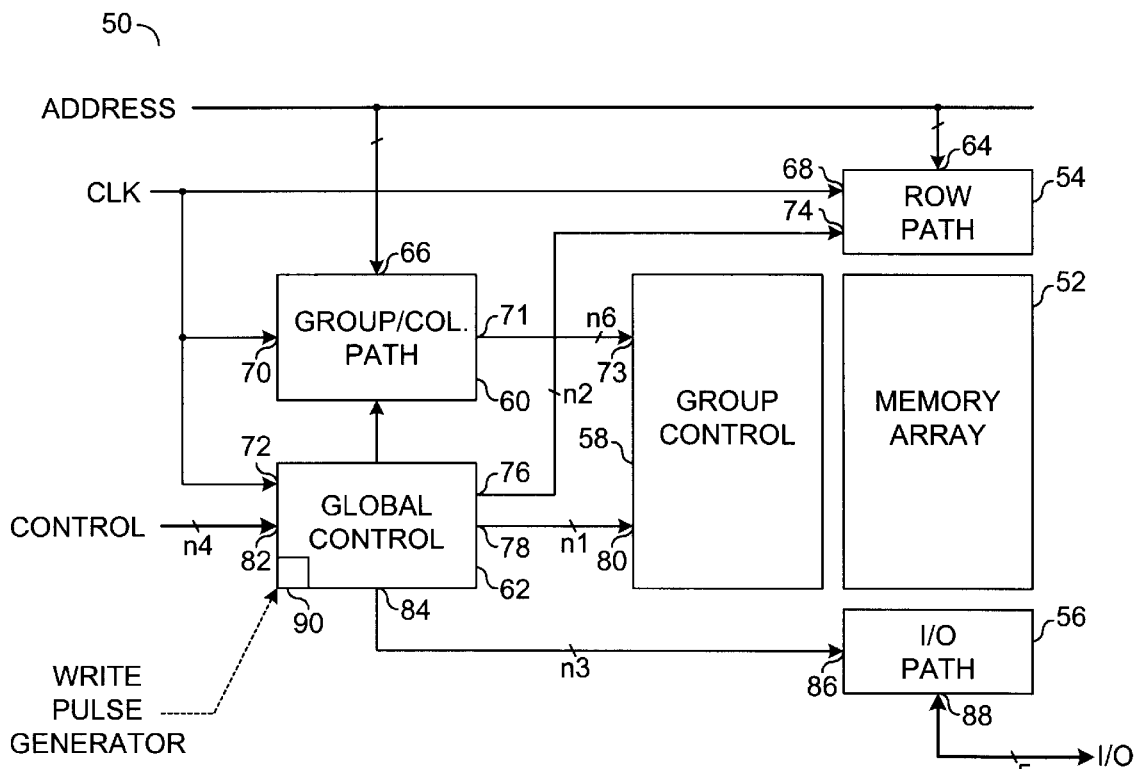
FIG. 3 is a block diagram of a typical synchronous memory.

Referring to FIG. 3, a block diagram of a circuit 50 is shown in accordance with a preferred embodiment of the present invention. The circuit 50 generally comprises a memory array 52, a row path block (or circuit) 54, an I/O path block (or circuit) 56, a group control block (or circuit) 58, a group/column path block (or circuit) 60, and a global control block (or circuit) 62. The row path block 54 and the group/column path block 60 each received a signal (i.e., ADDRESS) from an external device at an input 64 and an input 66, respectively. The row path block 54 also has an input 68 that receives an external clock (e.g., CLK). The group/column path block 60 also has an input 70 that may receive the external clock CLK. The group/column path block 60 also has an output 71 that may present a multi-bit signal to an input 73 of the group control block 58. The global control block 62 may have an input 72 that may receive the external signal CLK. The row path block 54 may also have an input of 74 that may receive a multi-bit signal from an output 76 of the global control block 62.

The global control block 62 may have an output 78 that may present a multi-bit signal to an input 80 of the group control block 58. One of the bits of the multi-bit signal presented to the input 80 may be a write pulse (to be described in more detail in connection with FIGS. 4 and 5). The global control block 62 may also have an input 82 that may receive a multi-bit control signal (i.e., CONTROL). The global control block 62 may also have an output 84 that presents a multi-bit signal to an input 86 of the I/O path block 56. The I/O path block 56 may also have a multi-bit input/output 88. The global control block 62 generally includes a pulse generator 90 that may be used to present the write pulse as one of the bits of the multi-bit signal presented at the output 78.

Figure 4:
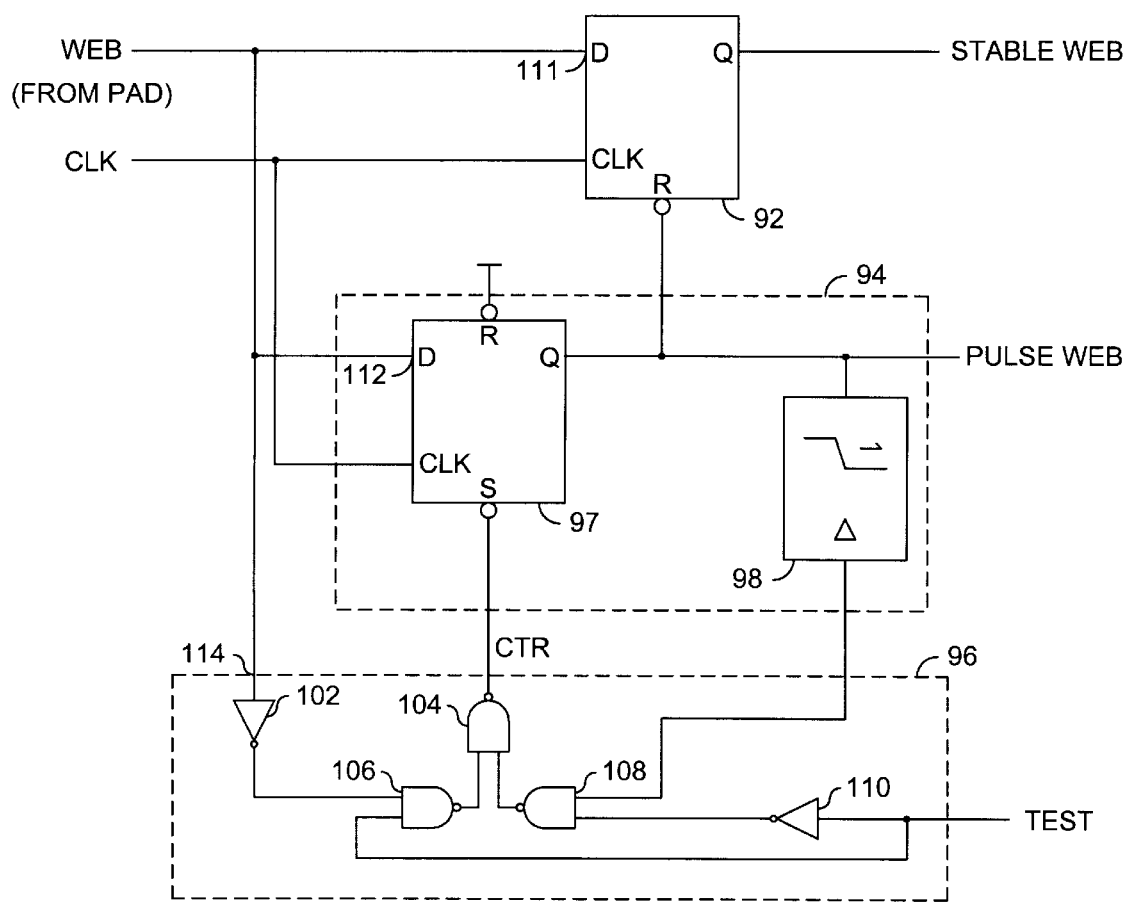
FIG. 4 is a block diagram of a pulse generator in accordance with a preferred embodiment of the present invention.

Referring to FIG. 4, a more detailed diagram of the pulse generator 90 is shown. The pulse generator 90 generally comprises a register 92, a pulse block 94 and a logic block 96. The pulse block 94 may comprise a register 97 and a delay element 98. The logic block 96 generally comprises an inverter 102, a NAND gate 104, a NAND gate 106, a NAND gate 108 and an inverter 110. The signal WEB is generally presented to an input 111 of the register 92, an input 112 of the register 97, and an input 114 of the logic block 96. The signal WEB is generally received from an external device (not shown) through, for example, a pad.

The signal WEB may be presented to a first input of the NAND gate 106, through the inverter 102. An input signal (e.g., TEST) may be presented to a first input of a NAND gate 108, through the inverter 110. The signal TEST may also be presented to a second input of the NAND gate 106. The delay element 98 may present a signal to a second input of the NAND gate 108. The NAND gate 104 may have a first input that may be received from the NAND gate 106 and second input that may be received from the NAND 108. The NAND gate 104 may present a control signal (e.g., CTR) that may be received at a set input of the register 97. The signal CTR may be used to control the pulse width of the signal presented by the register 97. The register 97 is shown having a reset input that is connected to a supply voltage. In an alternate embodiment of the present invention (not shown), the reset input of the register 97 may be connected to the output of the register 92 through a logic block (not shown). The logic block may be implemented, in one example, as a one-shot generation device that detects a negative edge and resets the register 97. Such an alternate implementation may provide additional flexibility when the timing of the input signals of the pulse generator 90 is out of specification. For example, the reset input of the register 97 may be used to fix a failure mode of the pulse generator 90 that may occur when in the out of specification condition.

Each of the logic gates 102, 104, 106, 108 and 110 may be implemented as an opposite polarity device. Specifically, the NAND gates 104, 106 and 108 may be implemented as AND gates to meet the design criteria of a particular implementation. In such an example, the inverter 102 may not be present. Additionally, the set input of the register 97 and the reset input of the register 92 may have inverted polarities of those shown in FIG. 4. The delay element 98 is shown in FIG. 4 as an element that presents a delay in response to a negative transition of the signal WEB, which may allow the pulse generator 90 to have a faster setup for the next transition. If the polarities of the logic gates 102, 104, 106, 108 and 110 and the signal WEB have opposite polarities, the delay element may be implemented as a device that may respond to a positive transition of the signal WEB.

Figure 5:
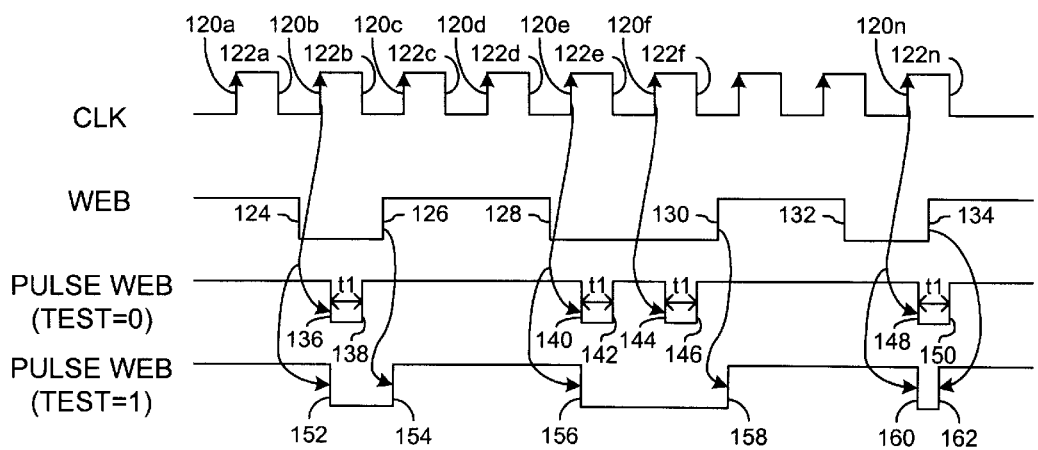
FIG. 5 is a timing diagram of the waveforms of FIG. 4.

Referring to FIG. 5, the timing diagram of the various waveforms of FIG. 4 shown. The signal CLK is shown having a number of positive transitions 120a–120n and a number of negative transitions 122a–122n. The signal WEB is shown having a negative transition 124, a positive transition 126, a negative transition 128, a positive transition 130, a negative transition 132 and a positive transition 134. The signal pulseWEB is shown having a waveform where the signal TEST is in a first state (e.g., a "0") and a second waveform where the signal TEST is in the second state (e.g., "1"). When the signal TEST is a zero, the signal pulseWEB has a negative transition 136 that generally responds to the positive transition 120b of the signal CLK, a positive transition 138, a negative transition 140 that may respond to the positive transition 120e of the signal CLK, a positive transition 142, a negative transition 144 that may respond to the positive transition 120f of the signal CLK, a positive transition 146, a negative transition 148 that may respond to the positive transition 120n of the signal CLK, and a positive transition 150. When the signal TEST is equal to a one, the waveform pulseWEB may have a negative transition 152 that generally responds to the positive transition 120b of the signal CLK, a positive transition 154, a negative transition 156 that may respond to the positive transition 120e of the signal CLK, a positive transition 158, a negative transition 160 that may respond to the positive transition 120n of the signal CLK, and a positive transition 162. In general, when the signal TEST is equal to a one, there are no transitions between the negative transition 156 and the positive transition 158. This is in contrast to the positive transition 142 and the negative transition 144 that generally occur when the signal TEST is equal to a zero.

When in the normal mode, the time between the negative transition 136 and the positive transition 138 is generally a fixed time (e.g., ti). Additionally, the time between the negative transition 140 and the positive transition 142, the negative transition 144 and the positive transition 146 and the negative transition 148 and the positive transition 150 are each equal to the fixed delay t1. The delay t1 generally occurs in response to the delay element 98, the NAND gate 108, the NAND gate 104 and the set path of the register 97. In contrast, when in a test mode, the time between the negative transitions (e.g., 152, 156 and 160) and the positive transitions (e.g., 154, 158 and 162) may be a variable time period. The positive transition of the output signal (e.g., the transitions 154, 158 and 162) may be set by the positive transitions (e.g., 126, 130 and 134) of the signal WEB. For example, the time between the transition 152 and 154 is shown to be less than the time between the transition 156 and 158. Additionally, the time between the transition 160 and 162 is different than the time between 152 and 154 or the transitions 156 and 158. When in the test mode, the signal pulseWEB has a positive transition 154, 158 or 162 that generally occurs after the positive transition 126, 130 or 134 of the signal WEB.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a first circuit configured to generate an output signal having a variable pulse width in response to (i) an input signal, (ii) a control signal and (iii) a clock signal; and a second circuit configured to generate said control signal in response to (i) said input signal and (ii) a test input.

2. The apparatus according to claim 1, wherein said first circuit comprises:

a register configured to generate said output signal; and an edge detection circuit coupled to said output signal and configured to generate a second control signal.

3. The apparatus according to claim 2, wherein said second circuit generates said control signal in further response to said second control signal.

4. The apparatus according to claim 1, wherein said second circuit comprises:

a plurality of first gates; and a plurality of second gates coupled to said plurality of first gates.

5. The apparatus according to claim 4, wherein:

said plurality of first gates each comprise NAND gates; and said plurality of second gates each comprise inverters.

6. The apparatus according to claim 5, wherein said test input is presented to (ii) a first one of said NAND gates and (ii) a second one of said NAND gates through one of said inverters.

7. The apparatus according to claim 6, wherein a third one of said NAND gates presents said control signal in response to (i) an input from said first one of said NAND gates and (ii) an input from said second one of said NAND gates.

8. The apparatus according to claim 1, further comprising a second register configured to present a second output in response to (i) said input signal, (ii) said output signal and (iii) said clock signal.

9. An apparatus comprising:

means for generating an output signal having a variable pulse width in response to (i) an input signal, (ii) a control signal and (iii) a clock signal; and means for generating said control signal in response to (i) said input signal and (ii) a test input.

10. A method for generating pulses in a memory comprising the steps of:

(a) generating an output signal having a variable pulse width in response to (i) an input signal, (ii) a control signal and (iii) a clock signal; and (b) generating said control signal in response to (i) said input signal and (ii) a test input.

11. The method according to claim 10, wherein step (a) generates said output signal in response to an edge detection signal.

12. The method according to claim 11, wherein step (b) generates said output signal in further response to a second control signal.

13. The method according to claim 10, wherein step (b) generates said control signal in response to:

(i) a plurality of first gates and (ii) a plurality of second gates.

14. The method according to claim 13, wherein:

said plurality of first gates each comprise a NAND gate; and said plurality of second gates each comprise an inverter.

15. The method according to claim 14, further comprising the step of:

presenting said test input to (i) a first one of said NAND gates and (ii) a second one of said NAND gates through one of said inverters.

16. The method according to claim 15, further comprising the step of:

presenting said control signal in response to (i) an input from said first one of said NAND gates and (ii) an input from said second one of said NAND gates.

17. The method according to claim 10, further comprising the step of presenting a second output in response to (i) said input signal, (ii) said output signal and (iii) said first clock signal.

18. The apparatus according to claim 2, wherein said register is configured to generate said output signal in response to (i) s aid input signal, (ii) said clock signal and (iii) said control signal.

* * * * *